(12) United States Patent
Nidhi et al.

(10) Patent No.: US 9,722,097 B2
(45) Date of Patent: Aug. 1, 2017

(54) SEMICONDUCTOR DEVICE AND METHOD FOR MANUFACTURING THE SAME

(71) Applicant: Vanguard International Semiconductor Corporation, Hsinchu (TW)

(72) Inventors: Karuna Nidhi, Patna (IN); Federico Agustin Altolaguirre, Zhubei (TW); Ming-Dou Ker, Jhubei (TW); Geeng-Lih Lin, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/856,176

(22) Filed: Sep. 16, 2015

(65) Prior Publication Data
US 2017/0077316 A1   Mar. 16, 2017

(51) Int. Cl.
*H01L 29/80* (2006.01)
*H01L 29/808* (2006.01)
(Continued)

(52) U.S. Cl.
CPC ...... *H01L 29/808* (2013.01); *H01L 21/76224* (2013.01); *H01L 29/0692* (2013.01); *H01L 29/1058* (2013.01); *H01L 29/66901* (2013.01)

(58) Field of Classification Search
CPC ............. H01L 21/84; H01L 29/0843; H01L 29/66901; H01L 29/8086; H01L 21/76224; H01L 29/0649; H01L 29/808
See application file for complete search history.

(56) References Cited

U.S. PATENT DOCUMENTS

2008/0272394 A1* 11/2008 Kapoor ............... H01L 29/0843
                                                      257/190
2008/0315266 A1* 12/2008 Eshun ................. H01L 27/0617
                                                      257/285
(Continued)

FOREIGN PATENT DOCUMENTS

TW    201131759 A1   9/2011
TW    201212208 A1   3/2012
(Continued)

*Primary Examiner* — Allen Parker
*Assistant Examiner* — Frederick B Hargrove
(74) *Attorney, Agent, or Firm* — Birch, Stewart, Kolasch & Birch, LLP

(57) ABSTRACT

A semiconductor device is provided. The semiconductor device includes a substrate; a well region disposed in the substrate; an isolation structure surrounding an active region in the well region; a source region disposed in the well region; a drain region disposed in the well region; a second conductive type first doped region disposed in the well region and disposed along a periphery of the active region; a second conductive type second doped region disposed in the well region and under the source region, the drain region and the second conductive type first doped region, wherein the second conductive type second doped region is in direct contact with the second conductive type first doped region; a source electrode; a drain electrode and a gate electrode. The present disclosure also provides a method for manufacturing the semiconductor device.

20 Claims, 12 Drawing Sheets

(51) Int. Cl.
*H01L 29/66* (2006.01)
*H01L 21/762* (2006.01)
*H01L 29/06* (2006.01)
*H01L 29/10* (2006.01)

(56) References Cited

U.S. PATENT DOCUMENTS

| | | | | |
|---|---|---|---|---|
| 2009/0101941 | A1* | 4/2009 | Ellis-Monaghan | H01L 29/1058 257/270 |
| 2010/0207173 | A1* | 8/2010 | Anderson | H01L 29/0843 257/270 |
| 2011/0284930 | A1* | 11/2011 | Hershberger | G06F 17/5068 257/270 |
| 2012/0292669 | A1* | 11/2012 | Candra | H01L 29/808 257/268 |
| 2013/0001656 | A1* | 1/2013 | El-Kareh | H01L 29/8086 257/263 |
| 2014/0061647 | A1* | 3/2014 | Werner | H01L 29/66431 257/51 |

FOREIGN PATENT DOCUMENTS

| WO | WO 2006/053055 A2 | 5/2006 |
|---|---|---|
| WO | WO 2009/108311 A2 | 9/2009 |

* cited by examiner

SEMICONDUCTOR DEVICE AND METHOD FOR MANUFACTURING THE SAME

BACKGROUND

Technical Field

The disclosure relates to a semiconductor device and a method for manufacturing the same, and in particular to a field effect transistor and a method for manufacturing the same.

Description of the Related Art

Junction field effect transistors (JFET) have been mostly used for analog switches and signal amplifiers, and especially for low noise amplifiers.

For a field effect transistor, an electric field near a carrier channel is mostly changed by controlling a signal (or bias of a gate), resulting in the change of the channel property and current property (between a source and a drain). Thus, the field effect transistor can be used for voltage controlled variable resistance, voltage controlled current source (VCCS), etc. The channel property and current property of the junction field effect transistor is changed by changing the width of the depletion region in the PN junction between the gate and the source/drain using the principle, whereby the function of the width of the deletion and the voltage is reversed.

Decreasing the gate voltage would increase the depletion region in the PN junction. If the gate voltage is low enough, all the channel is depleted and therefore no current flows from drain to source. The channel which is completely depleted is referred to as being pinched off. The gate voltage at which this effect occurs is referred to as the pinch-off voltage (VP). The present disclosure relates to a semiconductor device with low and adjustable the pinch-off voltage and a cost-effective method for manufacturing this semiconductor device.

SUMMARY

The present disclosure provides a semiconductor device, including: a substrate; a well region disposed in the substrate and having a first conductive type; an isolation structure disposed in the substrate and surrounding an active region in the well region; a source region disposed in the active region and in the well region; a drain region disposed in the active region and in the well region; a second conductive type first doped region disposed in the well region and disposed along a periphery of the active region, wherein the first conductive type is different from the second conductive type; a second conductive type second doped region disposed in the well region and under the source region, the drain region and the second conductive type first doped region, wherein the second conductive type second doped region is in direct contact with the second conductive type first doped region; a source electrode electrically connected to the source region; a drain electrode electrically connected to the drain region; and a gate electrode electrically connected to the second conductive type first doped region.

The present disclosure also provides a method for manufacturing a semiconductor device, including: providing a substrate; forming a well region in the substrate, wherein the well region has a first conductive type; forming an isolation structure in the substrate, wherein the isolation structure surrounds an active region in the well region; forming a source region in the active region and in the well region; forming a drain region in the active region and in the well region; forming a second conductive type first doped region in the well region, wherein the second conductive type first doped region is disposed along a periphery of the active region, wherein the first conductive type is different from the second conductive type; forming a second conductive type second doped region in the well region and under the source region, the drain region and the second conductive type first doped region, wherein the second conductive type second doped region is in direct contact with the second conductive type first doped region; forming a source electrode electrically connected to the source region; forming a drain electrode electrically connected to the drain region; and forming a gate electrode electrically connected to the second conductive type first doped region.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
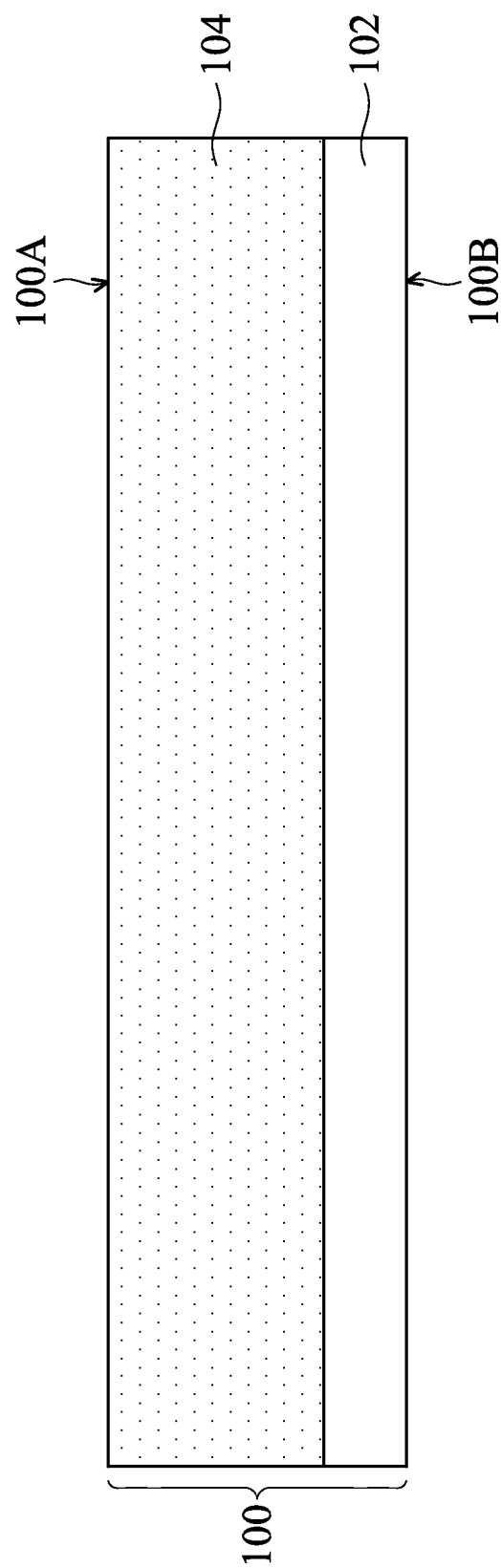
FIG. 1 is a cross-sectional view of a semiconductor device in one step of a manufacturing method of the semiconductor device according to an embodiment of the present disclosure.

The semiconductor device of the present disclosure and the method for manufacturing this semiconductor device are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first insulating bump disposed on/over a second material layer", may indicate the direct contact of the first insulating bump and the second material layer, or it may indicate a non-contact state with one or more intermediate layers between the first insulating bump and the second material layer. In the above situation, the first insulating bump may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

The present disclosure utilizes an isolated sub-well region to save the need of the mask for forming the channel, thereby reduces the cost. In addition, the unique configuration of the source region, drain region, gate region and channel realizes a semiconductor device with low and adjustable the pinch-off voltage.

FIGS. 1-5C are cross-sectional views or top views of an example semiconductor device at various manufacturing stages in accordance with some embodiments of the present disclosure. Referring to FIG. 1A, a substrate 100 is provided. The substrate 100 includes a top surface 100A and a bottom surface 100B.

The substrate 100 may include, but is not limited to, an element semiconductor such as silicon or germanium with single-crystal structure, poly-crystal structure or amorphous structure, a compound semiconductor which may include amorphous silicon, polycrystalline silicon, indium gallium zinc oxide, gallium nitride, silicon carbide, gallium arsenic, gallium phosphide, indium phosphide, indium arsenide or indium antimonide, an alloy semiconductor which may include SiGe alloy, GaAsP alloy, AlInAs alloy, AlGaAs alloy, GaInAs alloy, GaInP alloy and/or GaInAsP alloy, or a combination thereof.

In some embodiments, the substrate 100 may further include an epitaxial layer (not shown) over the aforementioned semiconductor. The epitaxial layer may include, but is not limited to, Si, Ge, Si/Ge, III-V compound, or a combination thereof. The epitaxial layer may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

Next, a doped isolation region 102 and a well region 104 are formed in the substrate 100. The well region 104 is formed over the doped isolation region 102. The well region 104 has a first conductive type. The doped isolation region 102 may have the first conductive type or a second conductive type. The first conductive type is different from the second conductive type.

The well region 104 may be formed by ion implantation. For example, when the first conductive type is N-type, the predetermined region for the well region 104 may be implanted with phosphorous ions or arsenic ions to form the well region 104.

It should be noted that, unless specifically defined as "lightly doped" or "heavily doped", the doped region has impurity concentration of above about $10^{14}/cm^3$ to about $10^{16}/cm^3$. In other words, in some embodiments, the well region 104 may have impurity concentration of above about $10^{14}/cm^3$ to about $10^{16}/cm^3$. One skilled in the art will recognize, however, that "doped region" is a term of art that depends upon the specific device type, technology generation, minimum feature size, and the like. It is intended, therefore, that the term be interpreted in light of the technology being evaluated and not be limited to the described embodiments.

Figure 2A:
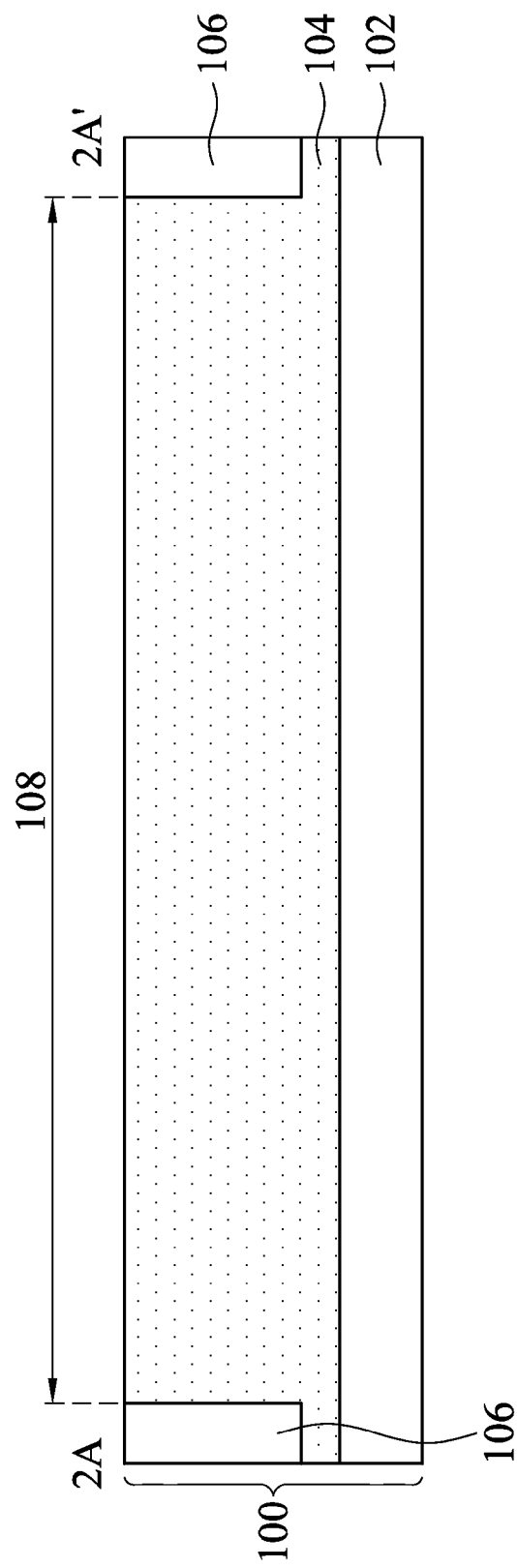
FIGS. 2A-2B are cross-sectional view and top view of a semiconductor device in one step of a manufacturing method of the semiconductor device according to an embodiment of the present disclosure.
Figure 2B:
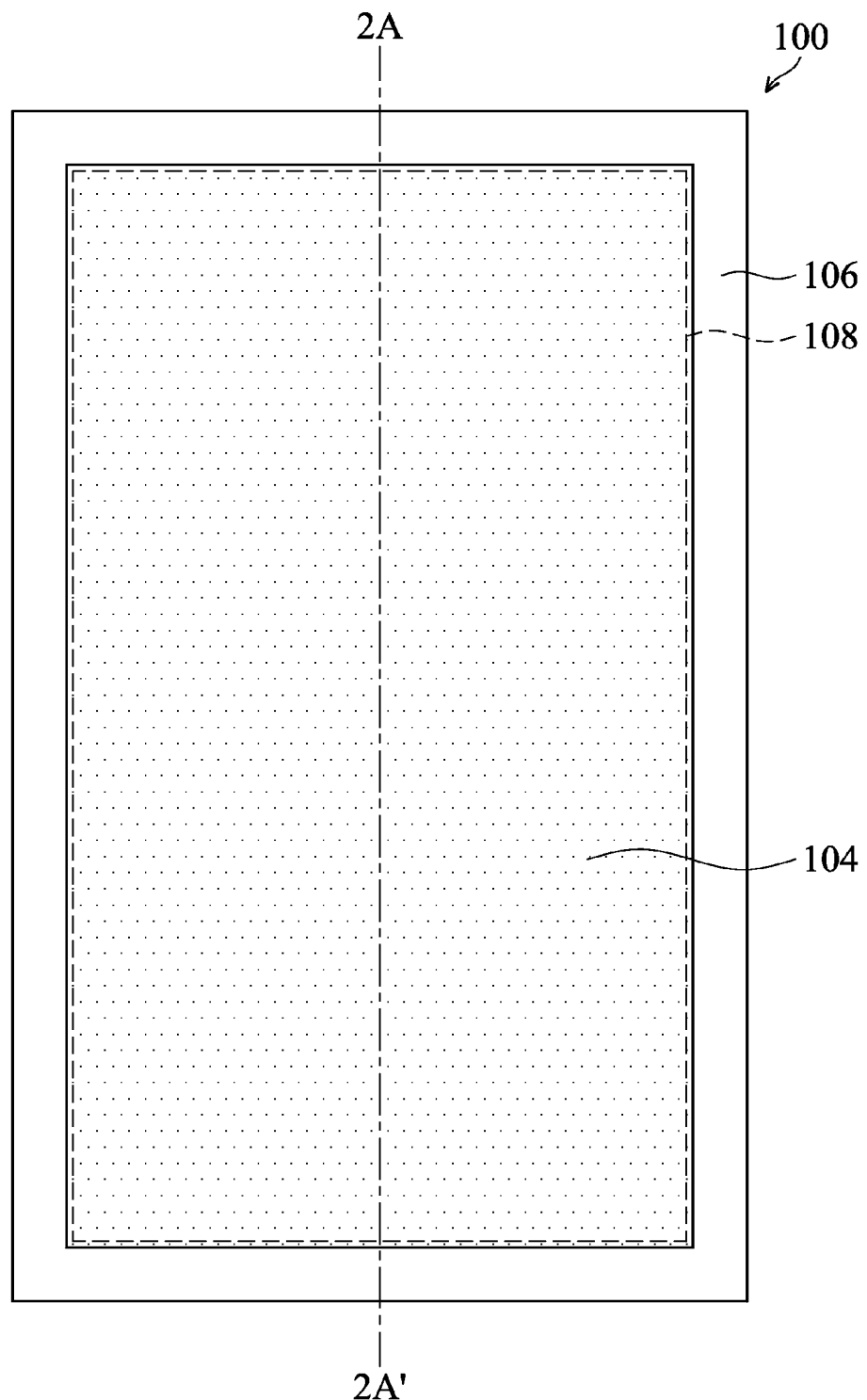

Subsequently, FIG. 2B is a top view of the substrate 100 in accordance with some embodiments of the present disclosure, and FIG. 2A is a cross-sectional view along line 2A-2A' in FIG. 2B in accordance with some embodiments of the present disclosure. Referring to FIGS. 2A and 2B, an isolation structure 106 is formed in the substrate 100. The isolation structure 106 surrounds an active region 108 in the well region 104. The isolation structure 106 may include, but is not limited to, a shallow trench isolation 106.

The isolation structure 106 may be formed with the following steps. First, a trench is formed at the predetermined region for the isolation structure 106. The trench may be formed by an etch process. The etch process may include wet etch, dry etch, or a combination thereof. The wet etch may include, but is not limited to, immersion etching, spray etching, or any other suitable etch process, or a combination thereof. The dry etch may include, but is not limited to, capacitively coupled plasma etching, inductively-coupled plasma etching, helicon plasma etching, electron cyclotron resonance plasma etching or any other suitable dry etch process, or a combination thereof. The dry etch process employs a process gas, which may include, but is not limited to, inert gas, fluorine-containing gas, chlorine-containing gas, bromine-containing gas, iodine-containing gas, a combination thereof or any other suitable gases. In some embodiments of the present disclosure, the processing gas may include, but is not limited to, Ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof or any other suitable gases.

Subsequently, an insulating material may be filled into the trench to form the isolation structure 106. The insulating material may include, but are not limited to, silicon oxide, silicon nitride, silicon oxynitride formed by chemical vapor deposition (CVD), any other suitable insulating materials, or a combination thereof. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Figure 3A:
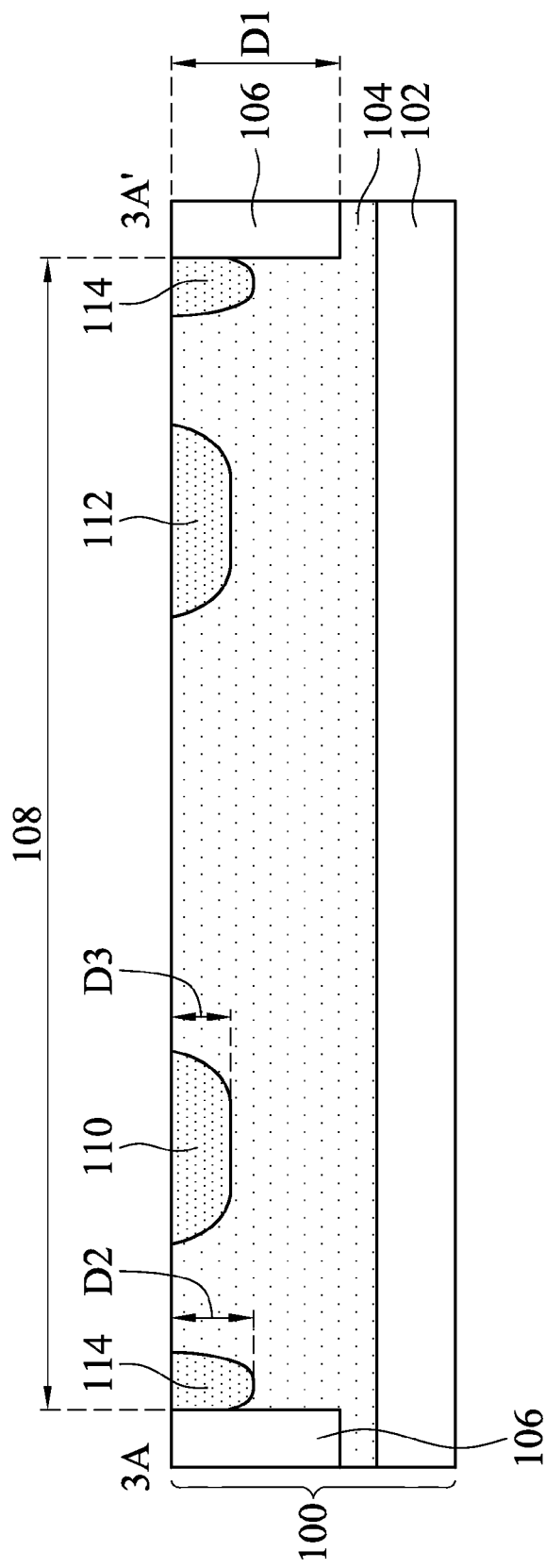
FIGS. 3A-3B are cross-sectional view and top view of a semiconductor device in one step of a manufacturing method of the semiconductor device according to an embodiment of the present disclosure.
Figure 3B:
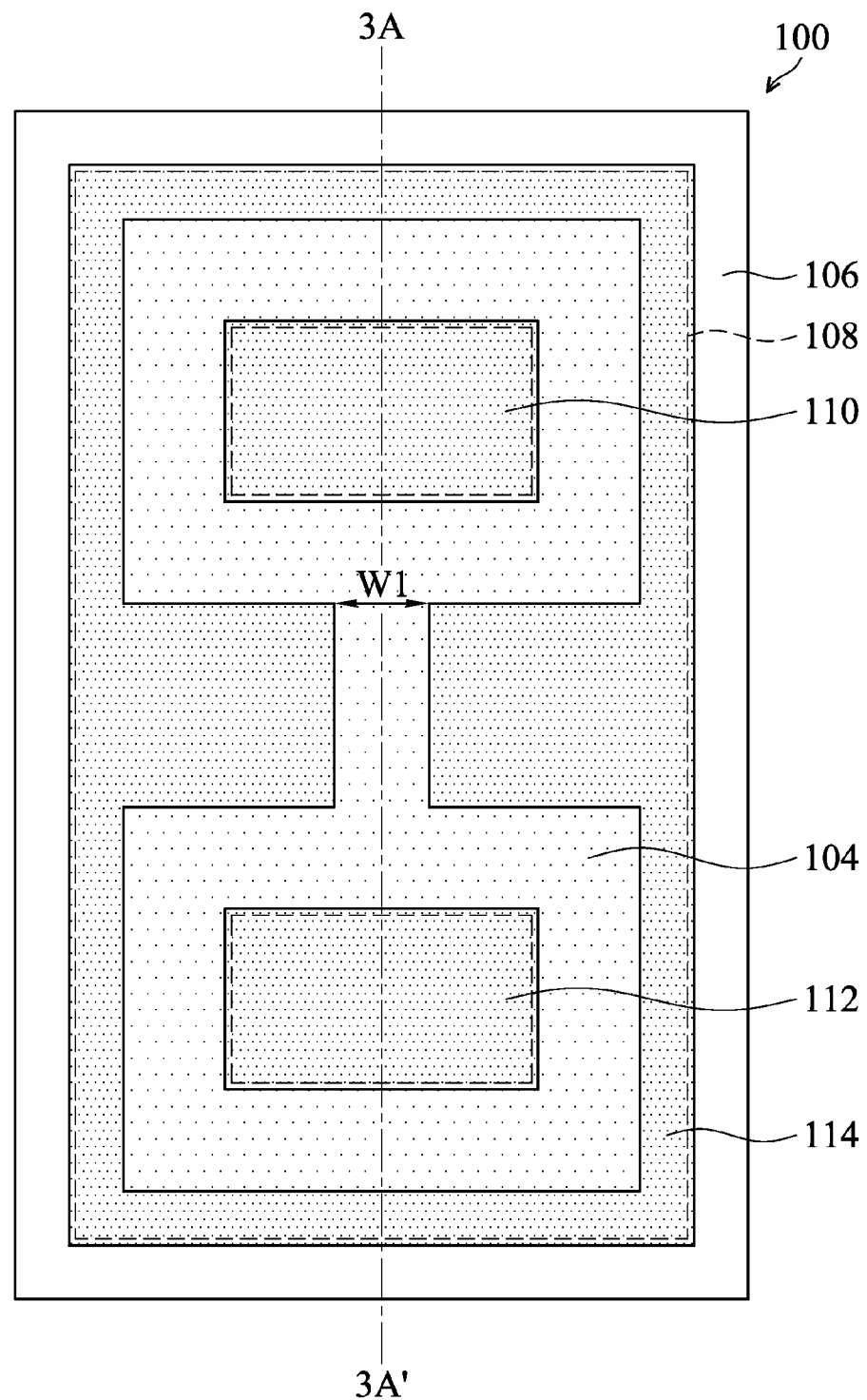

Subsequently, FIG. 3B is a top view of the substrate 100 in accordance with some embodiments of the present disclosure, and FIG. 3A is a cross-sectional view along line 3A-3A' in FIG. 3B in accordance with some embodiments of the present disclosure. Referring to FIGS. 3A and 3B, a source region 110 and a drain region 112 in the active region 108 and in the well region 104. The source region 110 and drain region 112 have the first conductive type and may be heavily doped.

In the described embodiments, the term "heavily doped" means an impurity concentration of above about $10^{17}/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

The source region 110 and drain region 112 may be formed by ion implantation. For example, when the first conductive type is N-type, the predetermined region for the source region 110 and drain region 112 may be implanted with phosphorous ions or arsenic ions to form the source region 110 and drain region 112.

In addition, also referring to FIGS. 3A and 3B, a second conductive type first doped region 114 is formed in the well region 104. In addition, the second conductive type first doped region 114 is disposed along a periphery of the active region 108, as shown in FIG. 3B. The second conductive type first doped region 114 has the second conductive type and may be heavily doped.

The second conductive type first doped region 114 may be formed by ion implantation. For example, when the second conductive type is P-type, the predetermined region for the second conductive type first doped region 114 may be implanted with boron ion, indium ion or boron difluoride ion ($BF_3^+$) to form the second conductive type first doped region 114.

In addition, in some embodiments, the second conductive type first doped region 114 may be in direct contact with the isolation structure 106. More specifically, when viewed from the top view such as FIG. 3B, the second conductive type first doped region 114 may be disposed along the four sides of the isolation structure 106 and may be in direct contact with the four sides of the isolation structure 106.

In addition, the isolation structure 106 has a first depth D1, the second conductive type first doped region 114 has a second depth D2, and the source region 110 and drain region 112 have a third depth D3. In some embodiments, the first depth D1 is greater than the second depth D2, and the second depth D2 is greater than the third depth D3 (D1>D2>D3).

Figure 4A:
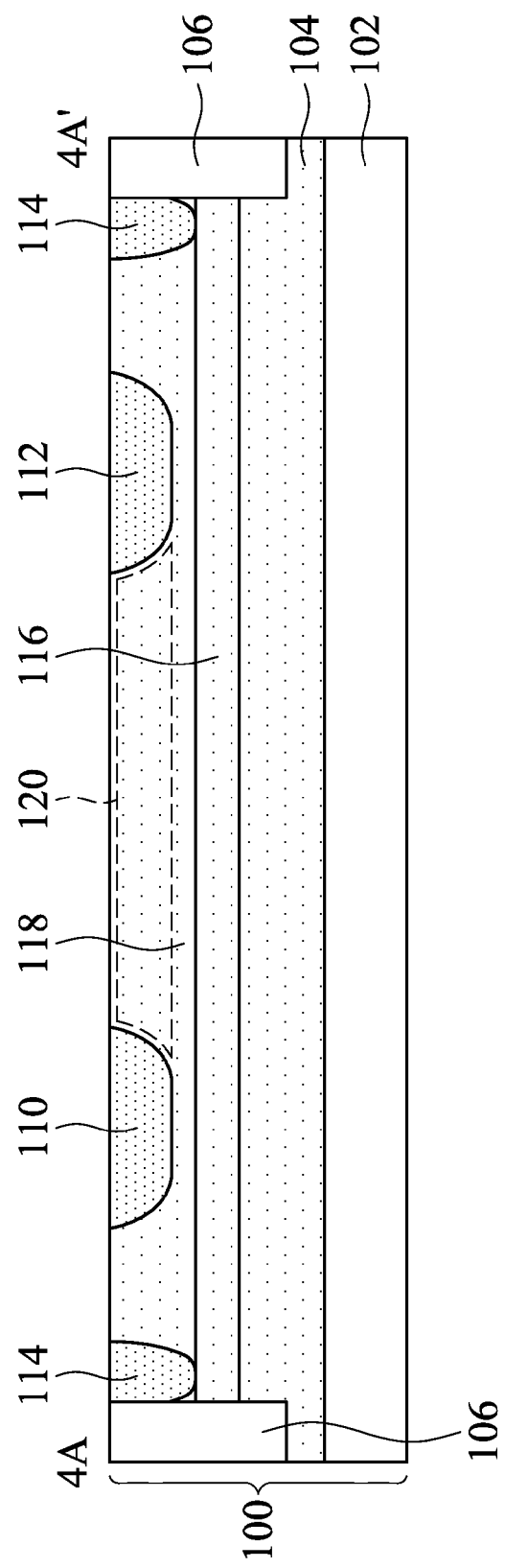
FIGS. 4A-4B are cross-sectional view and top view of a semiconductor device in one step of a manufacturing method of the semiconductor device according to an embodiment of the present disclosure.
Figure 4B:
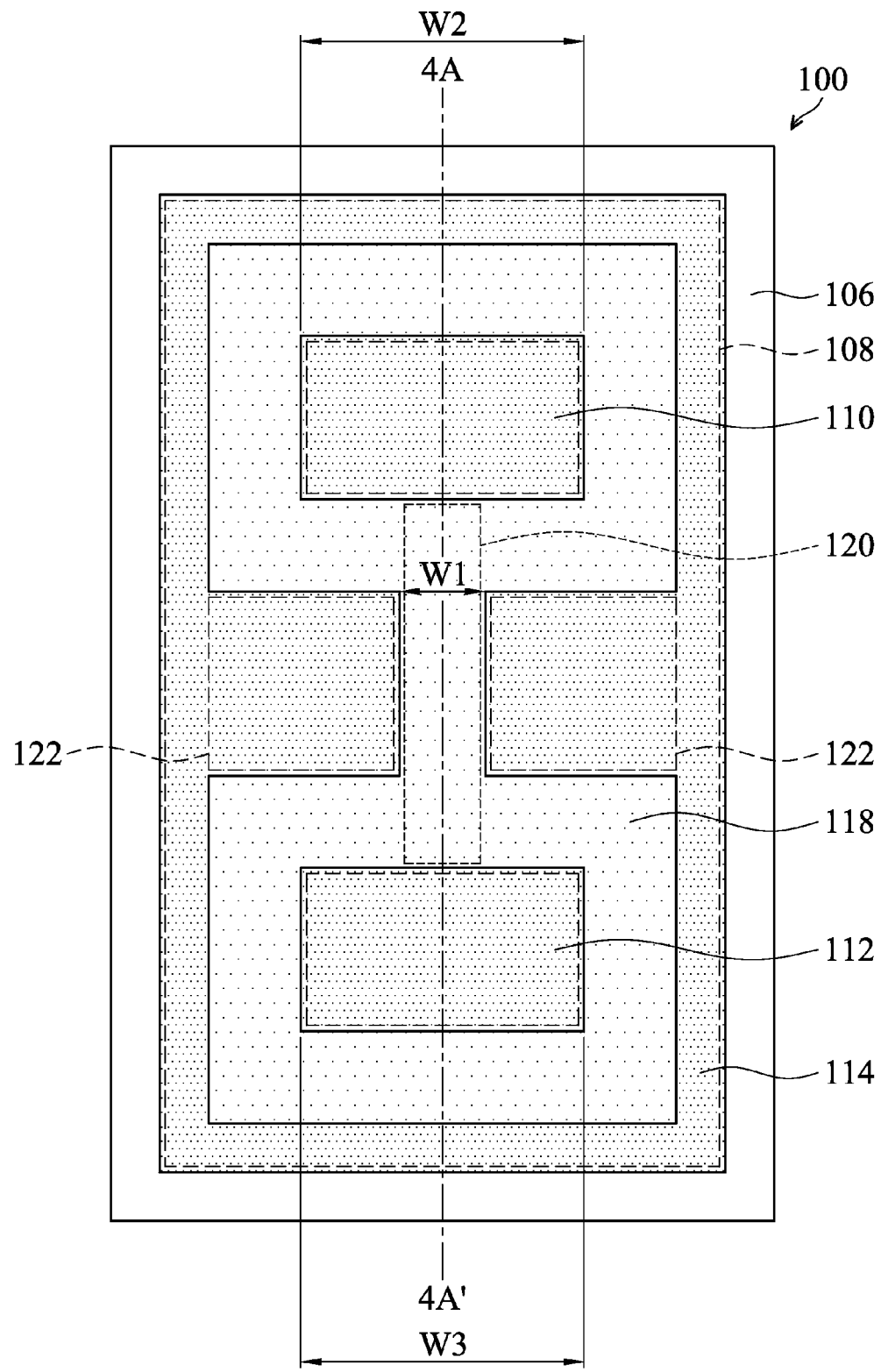

Subsequently, FIG. 4B is a top view of the substrate 100 in accordance with some embodiments of the present disclosure, and FIG. 4A is a cross-sectional view along line 4A-4A' in FIG. 4B in accordance with some embodiments of the present disclosure. Referring to FIG. 4A, a second conductive type second doped region 116 is formed in the well region 104 and under the source region 110, the drain region 112 and the second conductive type first doped region 114. In addition, the second conductive type second doped region 116 is in direct contact with the bottom of the second conductive type first doped region 114.

As shown in FIG. 4A, the second conductive type first doped region 114 and the second conductive type second doped region 116 together isolate an isolated sub-well region 118 in the well region 104. The source region 110 and the drain region 112 are disposed in the isolated sub-well region 118, and the isolated sub-well region 118 includes a channel region 120 between the source region 110 and the drain region 112.

In addition, as shown in FIG. 4B, the isolated sub-well region 118 encloses the source region 110 and the drain region 112, and the second conductive type first doped region 114 encloses the isolated sub-well region 118. The second conductive type first doped region 114 includes at least one gate region 122 disposed adjoining the channel region 120. For example, in some embodiments, the second conductive type first doped region 114 includes two gate region 122s disposed at opposite sides of the channel region 120 and disposed adjoining the channel region 120, as shown in FIG. 4B.

In some embodiments of the present disclosure, since the channel region 120 is formed without using a mask, the cost of manufacturing this semiconductor device may be reduced.

In addition, the channel region 120 has a width W1. Further, decreasing the gate voltage would increase the depletion region in the PN junction. If the gate voltage is low enough, all the channel is depleted and therefore no current flows from drain to source. The channel which is completely depleted is referred to as being pinched off. The gate voltage at which this effect occurs is referred to as the pinch-off voltage (VP).

By alternating the width W1 of the channel region 120, the pinch-off voltage of the semiconductor device may be adjustable. In addition, by applying the unique configuration of the source region 110, drain region 112, gate region 122 and channel region 120 as shown in FIG. 4B (the top view), the pinch-off voltage of the semiconductor device may be reduced. In some embodiments, the pinch-off voltage of the semiconductor device may be as low as −0.2V.

Still referring to FIG. 4A, the second conductive type second doped region 116 has the second conductive type. In some embodiments, the second conductive type second doped region 116 may have impurity concentration of above about $10^{14}/cm^3$ to about $10^{16}/cm^3$, for example from about $10^{15}/cm^3$.

The second conductive type second doped region 116 may be formed by ion implantation. For example, when the second conductive type is P-type, the predetermined region for the second conductive type second doped region 116 may be implanted with boron ion, indium ion or boron difluoride ion ($BF_3^+$) to form the second conductive type second doped region 116.

In addition, the source region 110 and the drain region 112 are not in direct contact with the second conductive type second doped region 116, as shown in FIG. 4A.

It should be noted that the exemplary embodiment set forth in FIGS. 4A-4B is merely for the purpose of illustration. In addition to the embodiment set forth in FIGS. 4A-4B, the source region and the drain region may be in direct contact with the second conductive type second doped region. This will be described in detail in the following description. Therefore, the inventive concept and scope are not limited to the exemplary embodiment shown in FIGS. 4A-4B.

In addition, the channel region 120 has a smaller width than the source region 110 and the drain region 112. In particular, the width W1 of the channel region 120 is smaller than the width W2 of the source region 110 and the width W3 of the drain region 112.

Figure 5A:
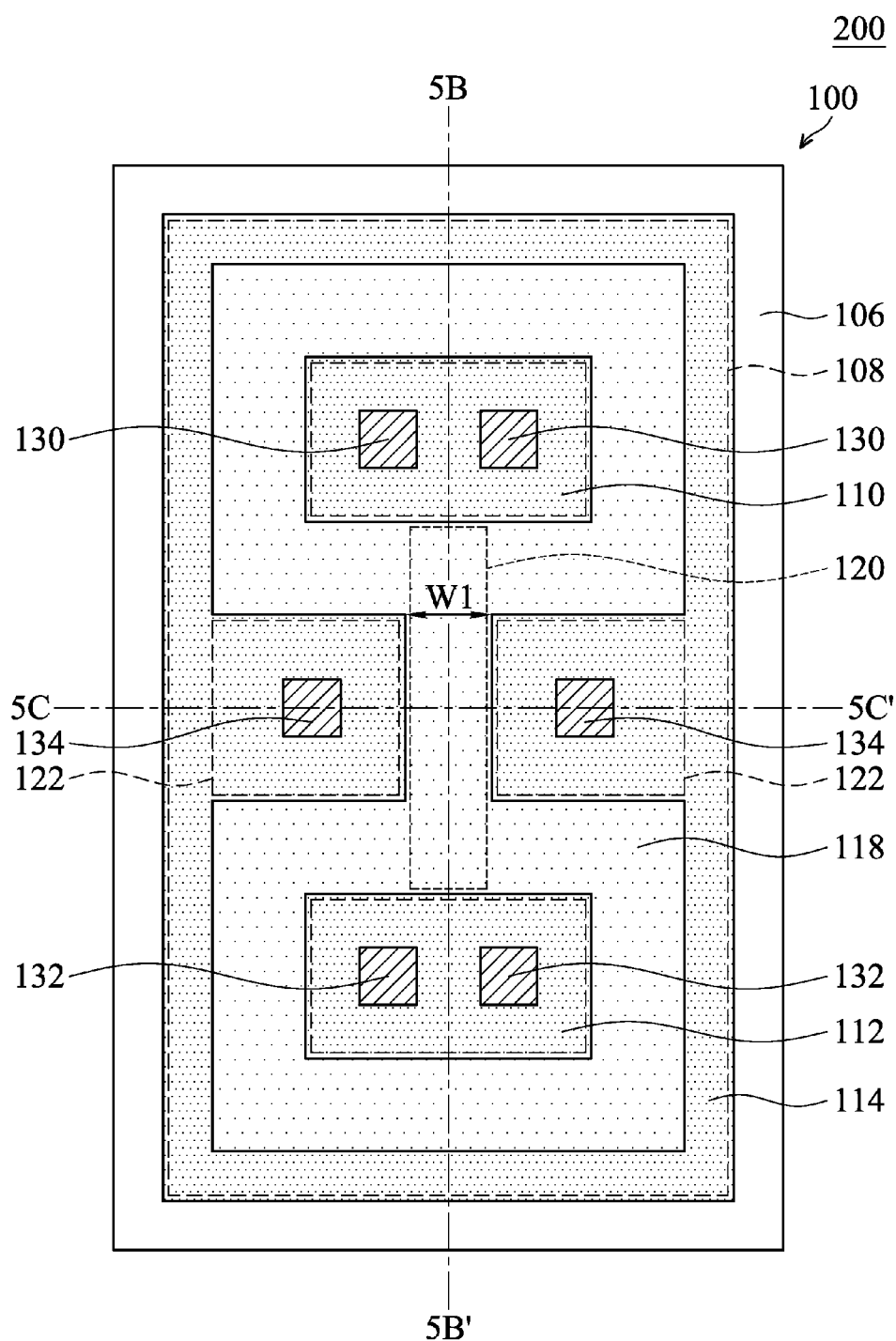
FIGS. 5A-5C are cross-sectional view or top view of a semiconductor device in one step of a manufacturing method of the semiconductor device according to an embodiment of the present disclosure.
Figure 5B:
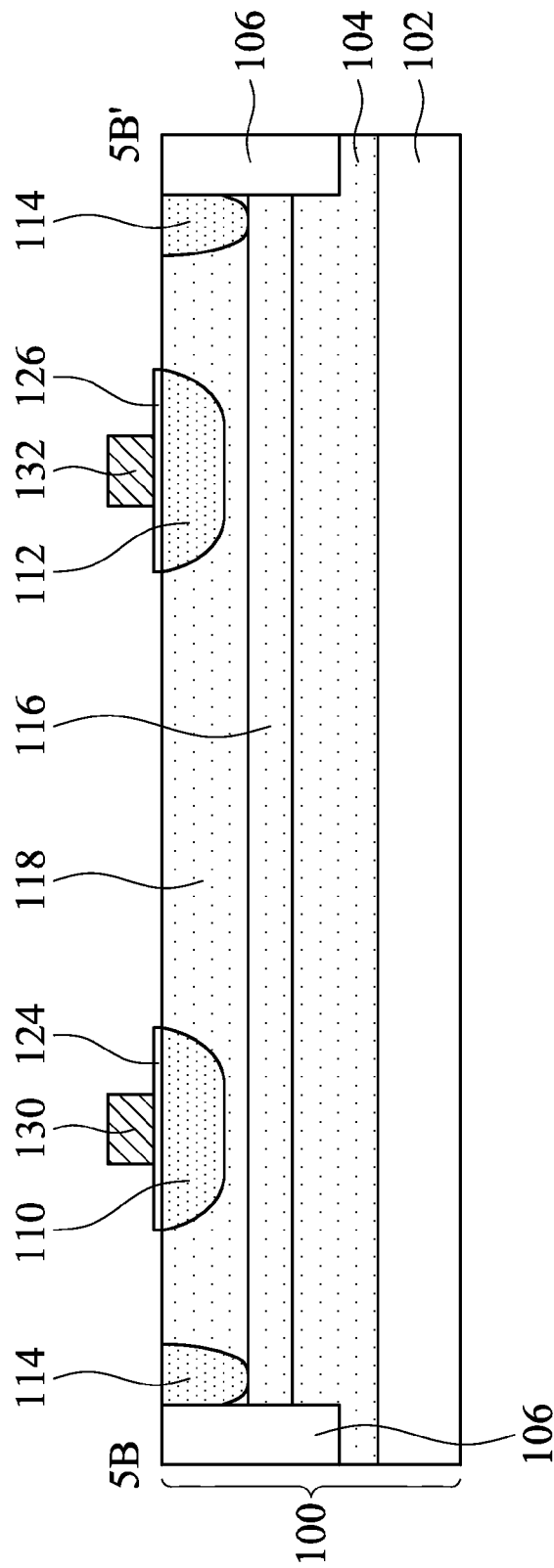
Figure 5C:
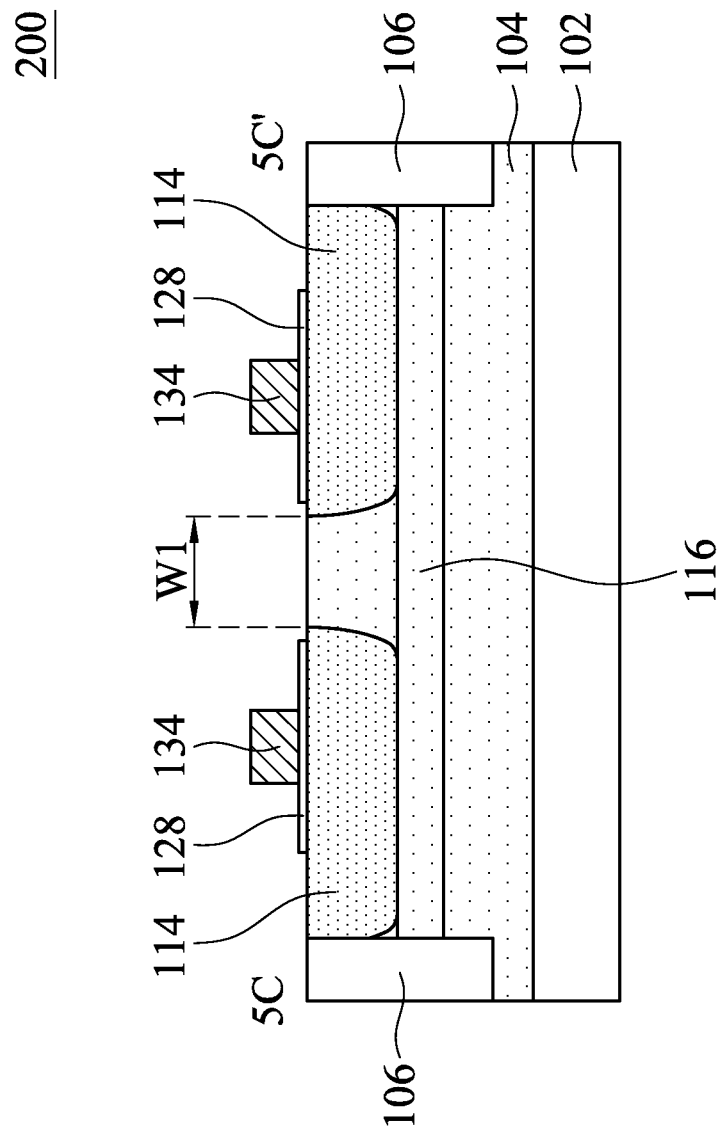

Subsequently, FIG. 5A is a top view of the semiconductor device 200 in accordance with some embodiments of the present disclosure. FIG. 5B is a cross-sectional view along line 5B-5B' in FIG. 5A in accordance with some embodiments of the present disclosure. FIG. 5C is a cross-sectional view along line 5C-5C' in FIG. 5A in accordance with some embodiments of the present disclosure.

Referring to FIGS. 5A-5C, a metal silicidation step may optionally be performed to form a metal silicide layer 124, 126 and 128 over the source region 110, the drain region 112 and the gate region 122 in the second conductive type first doped region 114, respectively. The metal silicide layer 124, 126 and 128 may further decrease the on-resistance of the device. The material of the metal silicide layer 124, 126 and 128 may include, but is not limited to, nickel silicide, cobalt silicide, tungsten silicide, titanium silicide, tantalum silicide, platinum silicide or erbium silicide. In addition, although the metal silicide layer 124, 126 and 128 are shown in FIGS. 5B-5C, the metal silicide layer 124, 126 and 128 are omitted in FIG. 5A for clarity.

Subsequently, a source electrode 130 is formed over the metal silicide layer 124 and electrically connected to the source region 110. A drain electrode 132 is formed over the metal silicide layer 126 and electrically connected to the drain region 112. Gate electrodes 134 is formed over the metal silicide layer 128 and electrically connected to the second conductive type first doped region 114. In other words, the gate electrode 134 is disposed over the gate region 122. In addition, although the source electrode 130 and drain electrode 132 is not disposed over the cross-line 5B-5B', they are still shown in FIG. 5B for clarity.

The source electrode 130, drain electrode 132 and gate electrode 134 may include, but is not limited to, copper, aluminum, molybdenum, tungsten, titanium, tantalum, platinum, hafnium, an alloy thereof, a combination thereof, or any other conductive material.

The material of the source electrode 130, drain electrode 132 and gate electrode 134 may be formed by chemical vapor deposition (CVD), sputtering, resistive thermal evaporation, electron beam evaporation, or any other suitable method. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Still referring to FIGS. 5A-5C, the semiconductor device 200 includes a substrate 100 and a well region 104 disposed in the substrate 100. The well region 104 has the first conductive type. The semiconductor device 200 further includes an isolation structure 106 disposed in the substrate 100 and surrounding an active region 108 in the well region 104. The semiconductor device 200 further includes a source region 110 disposed in the active region 108 and in the well region 104 and a drain region 112 disposed in the active region 108 and in the well region 104. The semiconductor device 200 further includes a second conductive type first doped region 114 disposed in the well region 104 and disposed along a periphery of the active region 108. The first conductive type is different from the second conductive type. The semiconductor device 200 further includes a second conductive type second doped region 116 disposed in the well region 104 and under the source region 110, the drain region 112 and the second conductive type first doped region 114. The second conductive type second doped region 116 is in direct contact with the second conductive type first doped region 114. The semiconductor device 200 further includes a source electrode 130 electrically connected to the source region 110, a drain electrode 132 electrically connected to the drain region 112 and a gate electrode 134 electrically connected to the second conductive type first doped region 114.

The second conductive type first doped region 114 and the second conductive type second doped region 116 together isolate an isolated sub-well region 118 in the well region 104. The source region 110 and the drain region 112 are disposed in the isolated sub-well region 118.

As shown in FIG. 5A, the isolated sub-well region 118 encloses the source region 110 and the drain region 112, and the second conductive type first doped region 114 encloses the isolated sub-well region 118. The isolated sub-well region 118 includes a channel region 120 between the source region 110 and the drain region 112, and the channel region 120 has a smaller width than the source region 110 and the drain region 112.

In addition, the second conductive type first doped region 114 includes at least one gate region 122 disposed adjoining the channel region 120. The gate electrode 134 is disposed over the gate region 122.

Figure 6:
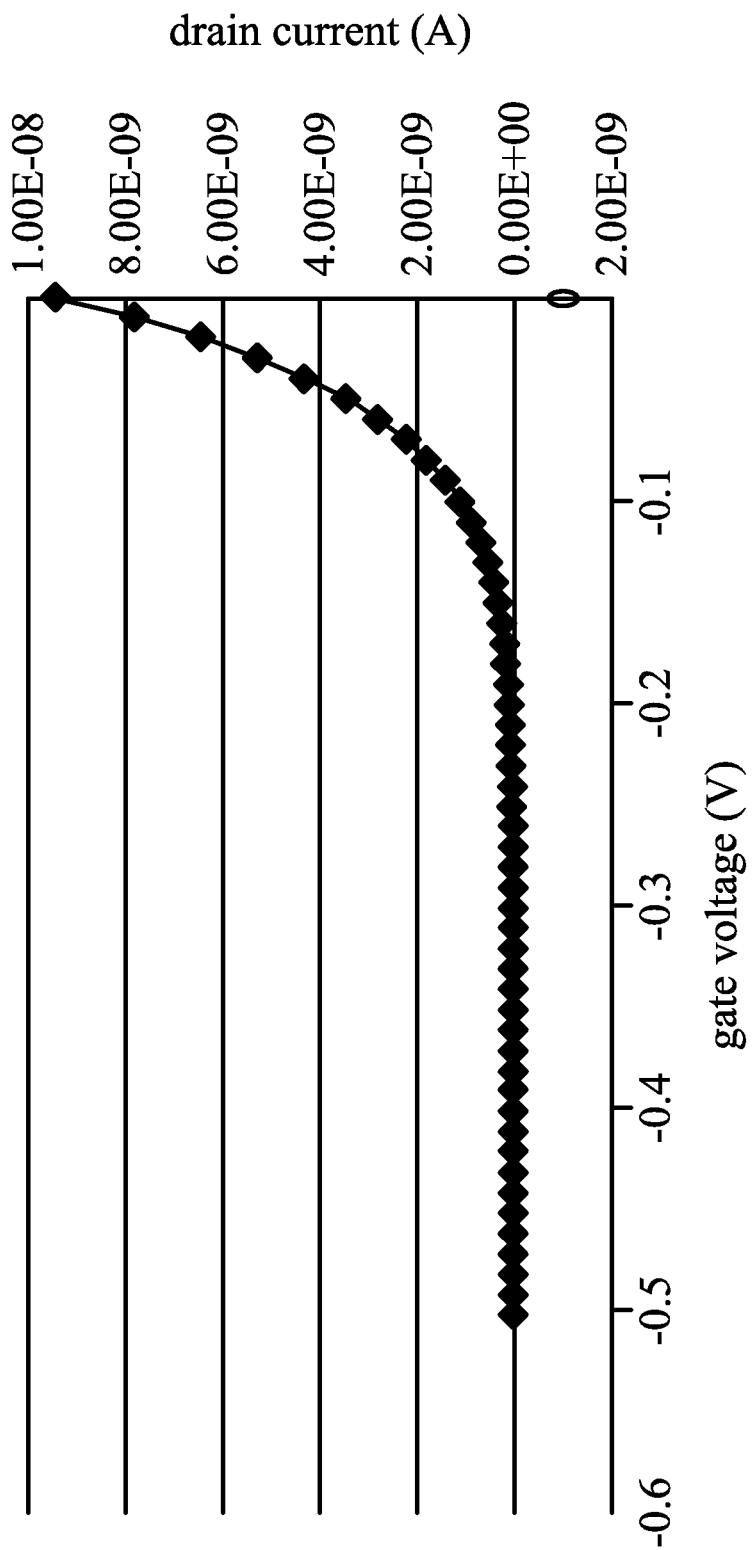
FIG. 6 is an analytical figure of the gate voltage versus current of an example semiconductor in accordance with some embodiments of the present disclosure.

FIG. 6 is an analytical figure of the gate voltage (horizontal axis) versus drain current (vertical axis) of an example semiconductor in accordance with some embodiments of the present disclosure. As shown in FIG. 6, by applying the unique configuration of the source region, drain region, gate region and channel region as shown in FIG. 5A (the top view), the pinch-off voltage of the semiconductor device may be reduced to as low as −0.2V.

The semiconductor device 200 may be a junction field effect transistor (JFET) and may be applied to switching application, current sources and electrostatic discharge (ESD) protection.

Figure 7:
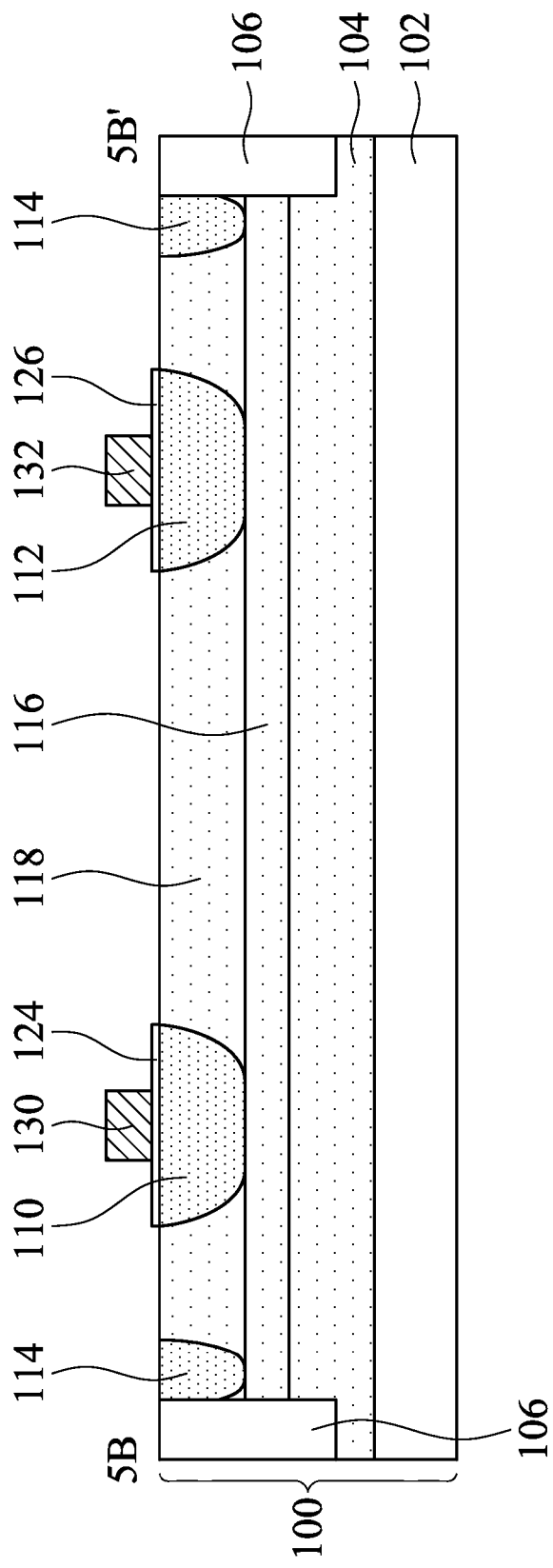
FIG. 7 is a cross-sectional view of a semiconductor device in accordance with another embodiment of the present disclosure.

FIG. 7 is a cross-sectional view of a semiconductor device in accordance with another embodiment of the present disclosure. The difference between the embodiments shown in FIGS. 5B and 7 is that the source region 110 and the drain region 112 are in direct contact with the second conductive type second doped region 116 in the embodiment shown in FIG. 7.

Note that the same or similar elements or layers corresponding to those of the semiconductor device are denoted by like reference numerals. The same or similar elements or layers denoted by like reference numerals have the same meaning and will not be repeated for the sake of brevity.

It should be noted that although the above description merely illustrates embodiments with the first conductive type being N-type and the second conductive type being P-type, those skilled in the art will appreciate that the first conductive type may be P-type with the second conductive type being N-type.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a well region disposed in the substrate and having a first conductive type;
   an isolation structure disposed in the substrate and surrounding an active region in the well region;
   a source region disposed in the active region and in the well region;
   a drain region disposed in the active region and in the well region;
   a second conductive type first doped region disposed in the well region and disposed along a periphery of the active region, wherein the first conductive type is different from the second conductive type, and the isolation structure surrounds the second conductive type first doped region, and the isolation structure has a first depth, the second conductive type first doped region has a second depth, and the first depth is greater than the second depth, and wherein there are no isolation structures in between the source region and the second conductive type first doped region in a cross-sectional view, and there are no isolation structures in between the drain region and the second conductive type first doped region in the cross-sectional view;
   a second conductive type second doped region disposed in the well region and under the source region, the drain region and the second conductive type first doped region, wherein the second conductive type second doped region is in direct contact with the second conductive type first doped region;
   a source electrode electrically connected to the source region;
   a drain electrode electrically connected to the drain region; and
   a gate electrode electrically connected to the second conductive type first doped region.

2. The semiconductor device as claimed in claim 1, wherein the source region and the drain region are not in direct contact with the second conductive type second doped region.

3. The semiconductor device as claimed in claim 1, wherein the source region and the drain region are in direct contact with the second conductive type second doped region.

4. The semiconductor device as claimed in claim 1, wherein the second conductive type first doped region is in direct contact with the isolation structure.

5. The semiconductor device as claimed in claim 1, wherein the second conductive type first doped region and the second conductive type second doped region together isolate an isolated sub-well region in the well region, wherein the source region and the drain region are disposed in the isolated sub-well region.

6. The semiconductor device as claimed in claim 5, wherein the isolated sub-well region encloses the source region and the drain region, and the second conductive type first doped region encloses the isolated sub-well region.

7. The semiconductor device as claimed in claim 5, wherein the isolated sub-well region comprises a channel region between the source region and the drain region, and the channel region has a smaller width than the source region and the drain region.

8. The semiconductor device as claimed in claim 7, wherein the second conductive type first doped region comprises at least one gate region disposed adjoining the channel region.

9. The semiconductor device as claimed in claim 8, wherein the second conductive type first doped region comprises two gate regions disposed at opposite sides of the channel region and disposed adjoining the channel region.

10. The semiconductor device as claimed in claim 8, wherein the gate electrode is disposed over the gate region.

11. A method for manufacturing a semiconductor device, comprising:
    providing a substrate;
    forming a well region disposed in the substrate and having a first conductive type;
    forming an isolation structure disposed in the substrate and surrounding an active region in the well region;
    forming a source region disposed in the active region and in the well region;
    forming a drain region disposed in the active region and in the well region;
    forming a second conductive type first doped region disposed in the well region and disposed along a periphery of the active region, wherein the first conductive type is different from the second conductive type, and the isolation structure surrounds the second conductive type first doped region, and the isolation structure has a first depth, the second conductive type first doped region has a second depth, and the first depth is greater than the second depth, and wherein there are no isolation structures in between the source region and the second conductive type first doped region in a cross-sectional view, and there are no isolation structures in between the drain region and the second conductive type first doped region in the cross-sectional view;

forming a second conductive type second doped region disposed in the well region and under the source region, the drain region and the second conductive type first doped region, wherein the second conductive type second doped region is in direct contact with the second conductive type first doped region;

forming a source electrode electrically connected to the source region;

forming a drain electrode electrically connected to the drain region; and forming a gate electrode electrically connected to the second conductive type first doped region.

12. The method for manufacturing the semiconductor device as claimed in claim 11, wherein the source region and the drain region are not in direct contact with the second conductive type second doped region.

13. The method for manufacturing the semiconductor device as claimed in claim 11, wherein the source region and the drain region are in direct contact with the second conductive type second doped region.

14. The method for manufacturing the semiconductor device as claimed in claim 11, wherein the second conductive type first doped region is in direct contact with the isolation structure.

15. The method for manufacturing the semiconductor device as claimed in claim 11, wherein the second conductive type first doped region and the second conductive type second doped region together isolate an isolated sub-well region in the well region, wherein the source region and the drain region are disposed in the isolated sub-well region.

16. The method for manufacturing the semiconductor device as claimed in claim 15, wherein the isolated sub-well region encloses the source region and the drain region, and the second conductive type first doped region encloses the isolated sub-well region.

17. The method for manufacturing the semiconductor device as claimed in claim 15, wherein the isolated sub-well region comprises a channel region between the source region and the drain region, and the channel region has a smaller width than the source region and the drain region.

18. The method for manufacturing the semiconductor device as claimed in claim 17, wherein the second conductive type first doped region comprises at least one gate region disposed adjoining the channel region.

19. The method for manufacturing the semiconductor device as claimed in claim 18, wherein the second conductive type first doped region comprises two gate regions disposed at opposite sides of the channel region and disposed adjoining the channel region.

20. The method for manufacturing the semiconductor device as claimed in claim 18, wherein the gate electrode is disposed over the gate region.

* * * * *